(12) United States Patent
Delbecq et al.

(10) Patent No.: US 11,854,801 B2
(45) Date of Patent: Dec. 26, 2023

(54) METHOD AND DEVICE FOR DEPOSITING A NANO-OBJECT

(71) Applicants: CENTRE NATIONAL DE LA RECHERCHE SCIENTIFIQUE, Paris (FR); ECOLE NORMALE SUPERIEURE, Paris (FR); SORBONNE UNIVERSITE, Paris (FR); UNIVERSITE DE PARIS, Paris (FR)

(72) Inventors: Matthieu Delbecq, Antony (FR); Tino Cubaynes, Heidelberg (FR); José Palomo, Argenteuil (FR); Matthieu Dartiailh, New York, NY (US); Takis Kontos, Paris (FR); Matthieu Desjardins, Paris (FR)

(73) Assignees: CENTRE NATIONAL DE LA RECHERCHE SCIENTIFIQUE, Paris (FR); ECOLE NORMALE SUPERIEURE, Paris (FR); SORBONNE UNIVERSITE, Paris (FR); UNIVERSITE DE PARIS, Paris (FR)

( * ) Notice: Subject to any disclaimer, the term of this patent is extended or adjusted under 35 U.S.C. 154(b) by 374 days.

(21) Appl. No.: 17/285,369

(22) PCT Filed: Oct. 18, 2019

(86) PCT No.: PCT/EP2019/078380
§ 371 (c)(1),
(2) Date: Apr. 14, 2021

(87) PCT Pub. No.: WO2020/079228
PCT Pub. Date: Apr. 23, 2020

(65) Prior Publication Data
US 2021/0375621 A1  Dec. 2, 2021

(30) Foreign Application Priority Data
Oct. 18, 2018 (FR) .................................. 1859645

(51) Int. Cl.
*H01L 21/02* (2006.01)
*B82B 3/00* (2006.01)
*H01L 21/66* (2006.01)

(52) U.S. Cl.
CPC ...... *H01L 21/02527* (2013.01); *B82B 3/0004* (2013.01); *B82B 3/0057* (2013.01); *H01L 22/14* (2013.01)

(58) Field of Classification Search
CPC ...... B82Y 40/00; B82B 3/0004; B82B 3/0057
See application file for complete search history.

(56) References Cited

U.S. PATENT DOCUMENTS

2002/0061662 A1   5/2002   Boggild

OTHER PUBLICATIONS

M. Muoth and C. Hierold, "Transfer of carbon nanotubes onto microactuators for hysteresis-free transistors at low thermal budget," 2012 IEEE 25th International Conference on Micro Electro Mechanical Systems (MEMS), Paris, France, 2012, pp. 1352-1355, doi: 10.1109/MEMSYS.2012.6170417. (Year: 2012).*

(Continued)

*Primary Examiner* — Jarrett J Stark
(74) *Attorney, Agent, or Firm* — Greer, Burns & Crain, Ltd

(57) ABSTRACT

A method for depositing an object, including: —approaching, in an enclosure, a holder in the direction of a carrier substrate, then—transferring, in the enclosure, the object from the holder to an area for depositing the carrier substrate. The transfer step is preferably carried out when the inside of the enclosure is in a vacuum at a pressure below $10^{-6}$ bar.

32 Claims, 5 Drawing Sheets

(56) References Cited

OTHER PUBLICATIONS

Blien, S., Steger, P., Albang, A., Paradiso, N. and Hüttel, A.K. (2018), Quartz Tuning-Fork Based Carbon Nanotube Transfer into Quantum Device Geometries. Phys. Status Solidi B, 255: 1800118. https://doi.org/10.1002/pssb.201800118 (Year: 2018).*

French Search Report received in Application No. 1859645 dated Jul. 8, 2019.

International Search Report and Written Opinion received in PCT/EP2019/078380, dated Dec. 9, 2019.

Gramich, J., et al., "Fork stamping of pristine carbon nanotubes onto ferromagnetic contacts for spin-valve devices," Phys. Status Solidi B 252, No. 11, 2015, pp. 2496-2502.

Wu, C., et al., "One-Step Direct Transfer of Pristine Single-Walled Carbon Nanotubes for Functional Nanoelectronics," Nano Letters 10, 2010, pp. 1032-1036.

* cited by examiner

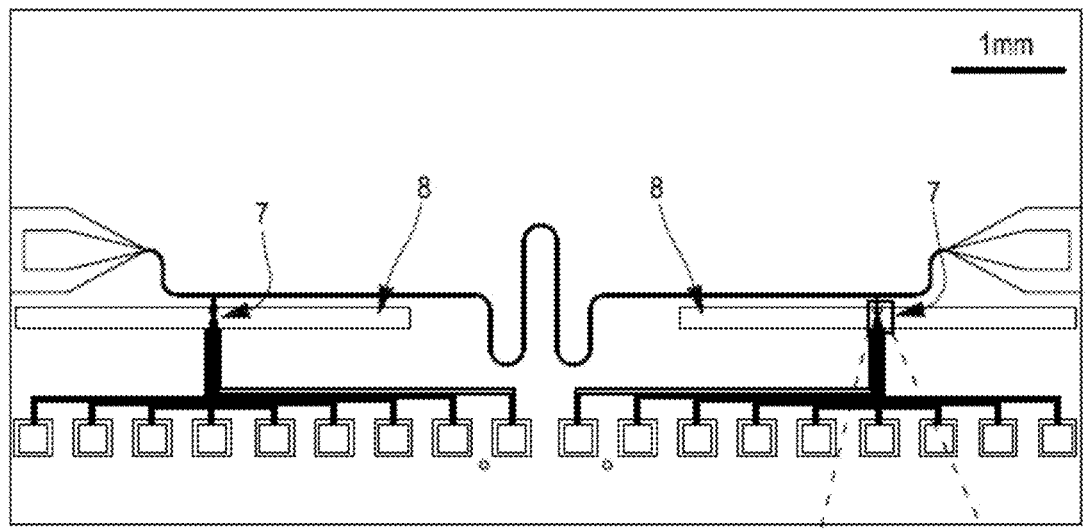
FIG. 7a
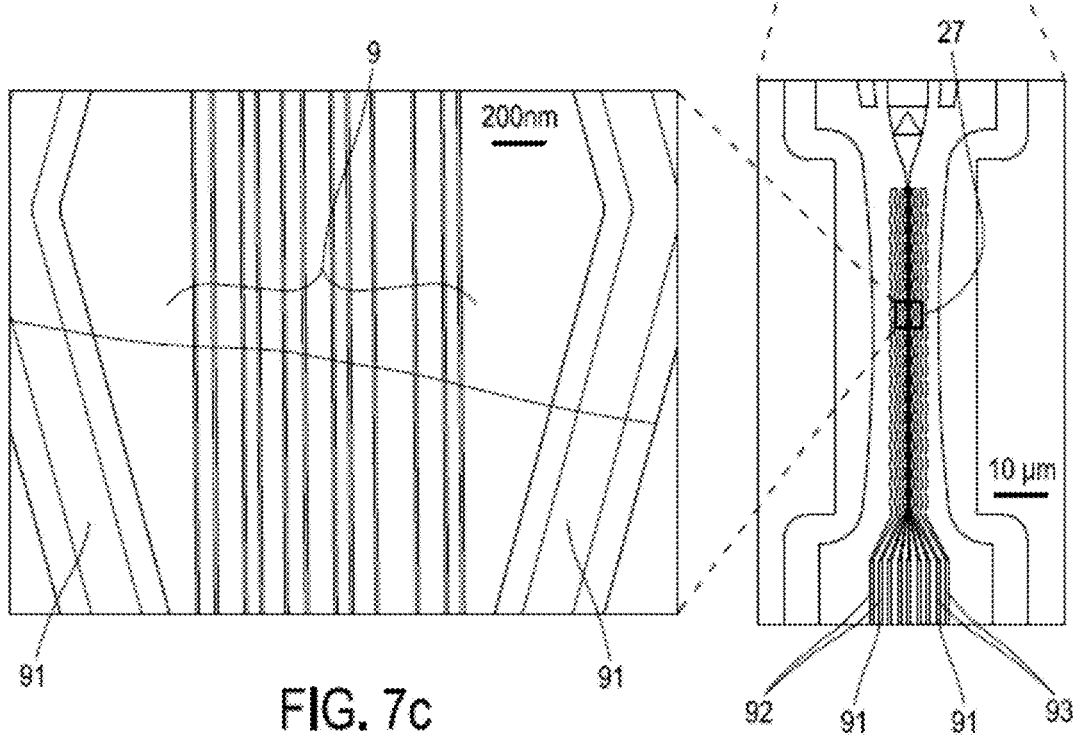
FIG. 7c
FIG. 7b

METHOD AND DEVICE FOR DEPOSITING A NANO-OBJECT

BACKGROUND

The present invention relates to a method and a device for depositing a nano-object.

Such a device allows a user to deposit a nano-object on a surface.

The integration of nano-objects in an electronic component makes it possible to manufacture devices capable of reaching quantum limits. As quantum behaviour is very sensitive to environment, it is crucial to have a high-purity material available for quantum engineering technologies. Carbon nanotubes are materials having exceptional crystallinity, which allows them to be as mechanically resistant as diamond, while having record-breaking electron conductivity; the electrons being one hundred times more mobile than in silicon. Information can be encoded in quantum form in the spin of an electron and carbon nanotubes are an ideal host material for these electrons by virtue of their high crystalline purity. Carbon nanotubes also have an optical response covering a spectrum from the visible to near infrared according to the size of their diameter. They are therefore also integrated in optical or optoelectronic devices. These nano-objects are also integrated on silicon components in order to produce sensors that are very sensitive by virtue of the unequal surface/volume ratio of this material.

These properties are however degraded by defects or pollution on the nanotube. In addition, carbon nanotubes present a diversity of crystalline structure while growing and have a tendency to agglomerate. The ability to isolate and handle a single object without degrading it allows increased control to be exercised over the behaviour of the device using it. Also, the manufacture of electronic circuits with inks or thin films does not allow optimal control of the characteristics of the manufactured component. In addition, inks have chemical additives that modify the environment of the nanotube, which is a problem also found in nanotubes in solution. Similarly, integration with electronic lithography techniques degrades the crystalline structure of the nanotube as a result of the use of resin and of an electron microscope.

Integration of a single nanotube, with no pollution or defect and with the identified crystalline characteristics allows the properties of the nanotubes to be retained and ensures reproducibility and greater control of the devices. In addition, degradation of the nanotube and the presence of pollution has an impact on the success rate of the integration, which depends crucially on the quality of the contact between the nanotube and the target substrate.

In order to avoid defects on the nanotube, one method consists of transferring it mechanically suspended on a holder to the target substrate. This is carried out in the last step of manufacture in order to protect the nanotube from any degradation.

Such methods for depositing a nano-object, such as a carbon nanotube, are known, as for example described by:

"*One-Step Direct Transfer of Pristine Single-Walled Carbon Nanotubes for Functional Nanoelectronics*" by Chung Chiang Wu et al., Nanoletters 2010, 10, 1032-1036;

"*Fork stamping of pristine carbon nanotubes onto ferromagnetic contacts for spin-valve devices*" by J. Gramich et al., Phys. Status Solidi B 252, 2496 (2015).

The aim of the present invention is to solve at least one of the problems of such methods according to the state of the art, and in particular to propose a method and a device for depositing a nano-object allowing:

- obtention of samples or components that are cleaner and/or a transfer that is more systematic, and/or
- better control of the interface between the nano-object and the target substrate, and/or
- a better level of integration of the nano-object, and/or
- better reproducibility of the depositing or the integration of the nano-object, and/or
- better stability of the device produced, and/or
- improved speed of execution, and/or
- increased available surface on the target substrate, while limiting the contact areas between the holder and the target substrate during transfer, these contact areas generally being defined by trenches in the target substrate.

SUMMARY

This objective is achieved with a process for depositing an object (preferably a nano-object) comprising:

- approaching, in an enclosure, a holder in the direction of a carrier substrate, the holder carrying an object (preferably a nano-object) to be transferred, the holder preferably being a comb comprising at least two teeth, wherein a pair of adjacent teeth carries an object (preferably a nano-object) to be transferred extended between the two teeth of the pair, then
- a transfer, in the enclosure, of the object from the holder and to a deposit area of the carrier substrate (preferably when the deposit area is situated between the two teeth of the pair in the case of a comb).

The transfer step is preferably carried out when the inside of the enclosure is under vacuum at a pressure less than $10^{-6}$ bar.

The approach can comprise an optical control of:

- a tilt of the holder with respect to the deposit area, and/or
- a relative position between the holder and the deposit area, and/or
- at least one angle between the holder and the deposit area.

The method according to the invention (preferably the approach step) can comprise an adjustment, from outside the enclosure, of:

- a tilt of the holder with respect to the deposit area inside the enclosure, and/or
- a relative position between the holder and the deposit area inside the enclosure, and/or
- at least one angle between the holder and the deposit area inside the enclosure.

During the adjustment step:

- the holder is preferably mobile with respect to the enclosure, and
- the deposit area is preferably immobile with respect to the enclosure.

The transfer can be carried out at a temperature inside the enclosure greater than −50° C. and/or less than +90° C.

The temperature inside the enclosure can be equal to a temperature outside the enclosure.

The method according to the invention can comprise an encapsulation, in the enclosure and under vacuum at a pressure less than $10^{-6}$ bar, of the transferred object.

The carrier substrate can comprise, on either side of the deposit area, trenches in which are inserted the teeth of the holder during the transfer in the case where this holder is a comb.

The deposit area can comprise electrodes or an electronic circuit, such that these electrodes and/or the electronic circuit are in contact, at the end of the transfer step, with the object to be transferred.

The method according to the invention can comprise, during the transfer step, an electrical measurement between two measurement electrodes of the deposit area.

The deposit area can comprise two pairs of electrodes called cutting electrodes, the transfer preferably comprising an electric current flow between each pair of cutting electrodes so as to cut the object between each pair of cutting electrodes.

The method according to the invention can comprise, before the approach step, cleaning the deposit area inside the enclosure, preferably:
  by an ion gun, preferably an argon ion gun, and/or
  by stripping a protective layer with a plasma that selectively etches this protective layer.

The cleaning is preferably carried out when the inside of the enclosure is under vacuum at a pressure less than $10^{-6}$ bar.

The vacuum at a pressure less than $10^{-6}$ bar is preferably maintained from the cleaning step to the transfer step.

The holder is preferably isolated from the substrate in a separate area, called buffer area, which is separated from the enclosure by a valve, closed during the cleaning step.

The object to be transferred can comprise or consist of a nanotube and/or a nanofibre and/or a nanowire and/or a carbon nanotube, and/or graphene and/or a two-dimensional heterostructure and/or a nanoleaf.

The holder:
  can comprise at least five teeth, preferably at least 25 teeth, and/or
  can have pairs of adjacent teeth spaced apart by a gap, defined in a direction of alignment of the teeth, greater than 5 μm and/or less than 100 μm, and/or
  can have teeth each having a width, defined in a direction of alignment of the teeth, greater than 5 μm and/or less than 100 μm, and/or
  can have teeth each having a length, defined in a direction perpendicular to the direction of alignment of the teeth, greater than 5 μm and/or less than 1000 μm.

The method according to the invention can comprise, before the approach step, depositing or growing carbon nanotubes on the holder comprising:
  depositing catalyst on the holder, then
  growing nanotubes on the holder.

It is possible for the catalyst not to be deposited uniformly on the holder but to be deposited in a localized manner on a surface area less than 500 μm$^2$ per tooth at the end of several teeth of the holder.

The method according to the invention can comprise, before the approach step, a step of locating and/or selecting, on the holder, the object to be transferred.
The selection can comprise measuring conductivity and/or chirality and/or defects in the object to be transferred.

According to yet another aspect of the invention, a device is proposed for depositing an object (preferably a nano-object), said device comprising:
  an enclosure,
  means for carrying a holder, in a holder area, said holder preferably being a comb comprising at least two teeth,
  means arranged to carry a substrate in a deposit area,
  means for evacuation, arranged to create a vacuum in the enclosure at a pressure less than $10^{-6}$ bar,
  handling means arranged to approach the holder area, in the enclosure, in the direction of the deposit area, so as to allow a transfer, in the enclosure, of an object (preferably a nano-object), from the holder area to the deposit area.

The handling means are preferably arranged to approach the holder area, in the enclosure, in the direction of the deposit area, so as to allow a transfer, in the enclosure, of an object (preferably a nano-object), from the holder area to the deposit area while the inside of the enclosure is under vacuum at a pressure less than $10^{-6}$ bar created by the evacuation means.

The device according to the invention can comprise optical control means arranged for optical control of:
  a tilt of the holder with respect to the deposit area, and/or
  a relative position between the holder and the deposit area, and/or
  at least one angle between the holder and the deposit area.

The device according to the invention can comprise adjustment means arranged to adjust, from outside the enclosure:
  a tilt of the holder with respect to the deposit area inside the enclosure, and/or
  a relative position between the holder and the deposit area inside the enclosure, and/or
  at least one angle between the holder and the deposit area inside the enclosure.

The adjustment means can be arranged so that the holder area can be mobile with respect to the enclosure, while the deposit area is immobile with respect to the enclosure.

The handling means can be arranged to approach the holder area, in the enclosure, in the direction of the deposit area, so as to allow a transfer, in the enclosure, of an object (preferably a nano-object), from the holder area to the deposit area while the inside of the enclosure is at a temperature greater than −50° C. and/or less than +90° C.

The handling means can be arranged to approach the holder area, in the enclosure, in the direction of the deposit area, so as to allow a transfer, in the enclosure, of an object (preferably a nano-object), from the holder area to the deposit area while the temperature inside the enclosure is equal to the temperature outside the enclosure.

The device according to the invention can comprise encapsulation means arranged to encapsulate, in the enclosure and under vacuum at a pressure less than $10^{-6}$ bar, a transferred object (preferably a nano-object) in the deposit area.

The device according to the invention can comprise electrical and/or electronic means arranged to be connected to electrodes or an electronic circuit situated in the deposit area.

The electrical and/or electronic means can comprise means for carrying out an electrical measurement between two measurement electrodes situated in the deposit area.

The electrical and/or electronic means can comprise means for causing a current to flow between each pair of cutting electrodes situated in the deposit area so as to cut an object (preferably a nano-object) between each pair of cutting electrodes.

The device according to the invention can comprise cleaning means arranged to clean the deposit area inside the enclosure, the cleaning means preferably comprising:
  an ion gun, preferably an argon ion gun, and/or
  stripping means arranged to strip a protective layer by means of a plasma that selectively etches this protective layer.

The device according to the invention can comprise a valve arranged in order to:

in a closed position, isolate the holder area with respect to the deposit area, and in an open position, not isolate the holder area with respect to the deposit area.

According to yet another aspect of the invention, a comb is proposed comprising at least two teeth, wherein at least one pair of adjacent teeth carries an object (preferably a nano-object) to be transferred extended between the two teeth of the pair.

The object to be transferred can comprise or consist of a carbon nanotube, a nanowire and/or graphene or a two-dimensional heterostructure.

The comb can comprise:
  at least five teeth, preferably at least 25 teeth, and/or
  pairs of adjacent teeth spaced apart by a gap, defined in a direction of alignment of the teeth, greater than 5 μm and/or less than 100 μm, and/or
  teeth each having a width, defined in a direction of alignment of the teeth, greater than 5 μm and/or less than 100 μm, and/or
  teeth each having a length, defined in a direction perpendicular to the direction of alignment of the teeth, greater than 5 μm and/or less than 1000 μm.

A catalyst for growing nano-objects (such as nanotubes) can be deposited on the comb.

It is possible for the catalyst not to be deposited uniformly on the comb but to be deposited in a localized manner on a surface area less than 500 $\mu m^2$ per tooth at the end of several teeth of the comb. The holder or comb can comprise an adhesion layer for the nano-object.

The comb can comprise means for locating and/or selecting, on the comb, the object to be transferred. The comb can for example comprise means for measuring conductivity and/or defects of the object to be transferred. In a second variant the locating and/or selecting means can for example comprise an electrode on each tooth; preferably such that the two electrodes of a pair of teeth are arranged to measure the presence and/or the conductivity and/or defects of the object to be transferred situated between the teeth of this pair.

According to yet another aspect of the invention, a method is proposed for the use of this latter comb variant, in which an electrical response is monitored or controlled between the two electrodes of a pair of teeth.

According to yet another aspect of the invention, a method is proposed for the use of a comb according to the invention, in which an object (preferably a nano-object) situated between two teeth of a pair of teeth on the comb is located and/or selected by a Rayleigh spectroscopy method. This selection can comprise obtaining the metallic or semiconductor character of the object, determining the presence of defects on the object, and/or the chirality of the object.

BRIEF DESCRIPTION OF THE DRAWINGS

Other advantages and features of the invention will become apparent on reading the detailed description of implementations and embodiments that are in no way limitative, and from the following attached drawings:

FIG. 7 illustrates:
  in part (a), a variant of substrate 5 comprising two trenches and two deposit areas 7,
  in part (b) an enlargement of one of the deposit areas 7,
  in part (c) an enlargement of part 27 in FIG. 7(b).

DETAILED DESCRIPTION

As these embodiments are in no way limitative, it is possible in particular to consider variants of the invention comprising only a selection of characteristics described or illustrated below, in isolation from the other characteristics described or illustrated (even if this selection is isolated within a sentence containing these other characteristics), if this selection of characteristics is sufficient to confer a technical advantage or to differentiate the invention with respect to the state of the prior art. This selection comprises at least one, preferably functional, characteristic without structural details, and/or with only a part of the structural details if this part alone is sufficient to confer a technical advantage or to differentiate the invention with respect to the state of the prior art.

Firstly, with reference to FIG. 1, a comb 1 according to the invention will be described.

The comb 1 comprises at least two teeth 3, wherein a pair 33 of adjacent teeth 3 carries a nano-object 6 to be transferred, extended or suspended between the two teeth 3 of the pair 33.

The term nano-object will be used in the case of an object having at least one of its external dimensions (typically from its height, width, thickness, length) less than 100 nm:
  if its three external dimensions (defined along three orthogonal axes) are less than 100 nm: it is a nanoparticle,
  if two of its external dimensions (preferably defined along two orthogonal axes) are less than 100 nm: it is for example a hollow, single- or multi-wall nanotube which may be closed at at least one end, or a nanofibre, i.e. a solid fibre. A nanofibre that is an electrical conductor or semiconductor will be denoted hereinafter a nanowire.
  If one external dimension is less than 100 nm (typically its thickness), it is a nanoleaf.

Figure 1:
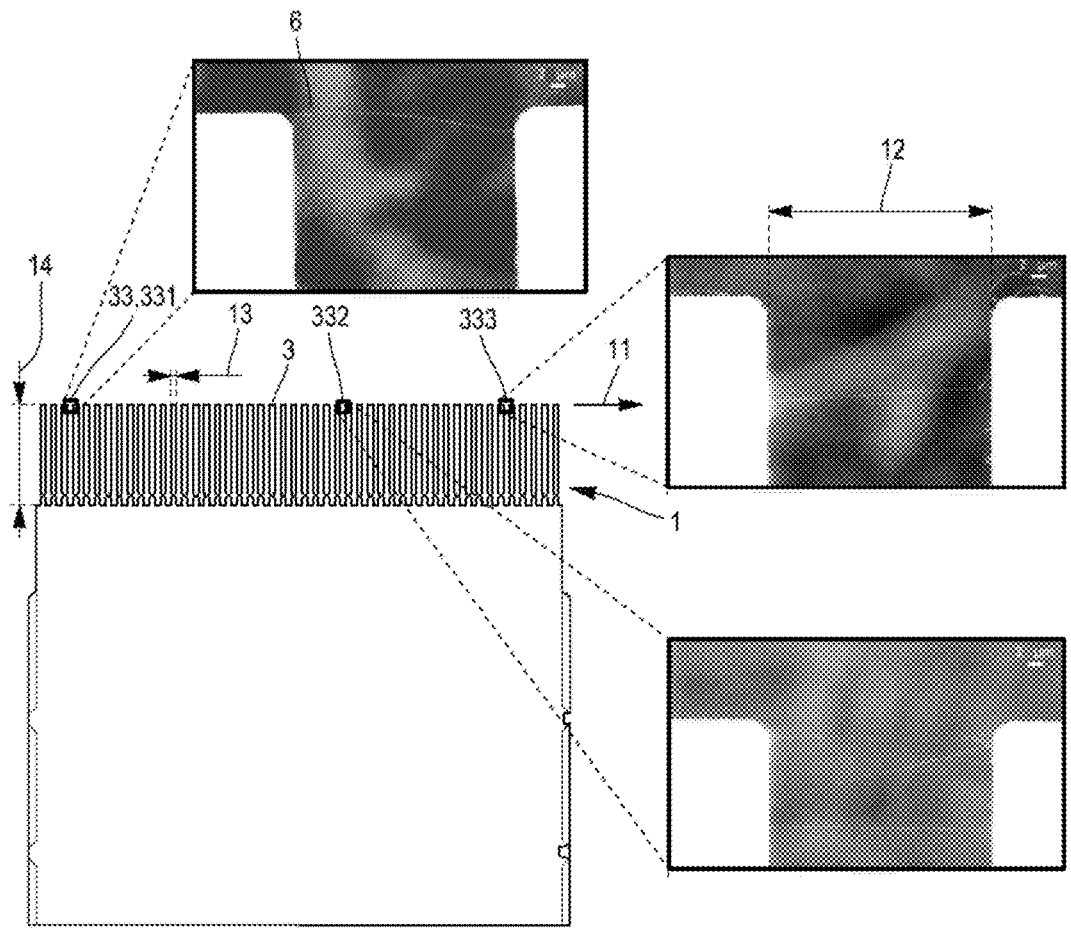
FIG. 1 is a profile view of a comb 1 according to the invention, with different enlargements of certain details.

In the example illustrated in FIG. 1, the nano-object 6 to be transferred is a carbon nanotube, i.e. a single layer of carbon atoms coiled on itself.

The comb 1 is a parallelepiped rectangle wherein one of the ends comprises all the teeth 3 aligned.

The comb 1 is typically a multilayer formed by successive layers of Si, $SiO_2$, Si, and $Si_3N_4$.

The comb 1 comprises at least five teeth 3, preferably at least twenty-five teeth 3. The example in FIG. 1 illustrates a comb 1 with forty-eight teeth 3.

The comb 1 has pairs of adjacent teeth 3 spaced apart by a regular gap 12, defined in a direction of alignment 11 of the teeth 3, greater than 5 μm and/or less than 100 μm, equal to 30 μm in FIG. 1.

The comb 1 has teeth 3 each having a width 13, defined in the direction of alignment 11 of the teeth 13, greater than 5 μm and/or less than 100 μm, equal to 30 μm in FIG. 1.

Each tooth 3 has a thickness (perpendicular to the plane of FIG. 1) of approximately 5 μm.

The teeth 3 are therefore situated along the direction 11 with a spatial periodicity corresponding to the sum of the distance 12 and the width 13.

The comb has teeth 3 each having a length 14, defined in a direction perpendicular to the direction of alignment 11 of the teeth, greater than 5 μm and/or less than 1000 μm, equal to 500 μm in FIG. 1.

The comb 1 is produced by different steps of etching and optical lithography.

The comb 1 with its teeth 3 having micrometric sizes forms a holder which has the least possible material, and:
- allows minimal contact surface stresses between the comb 1 and the target substrate 5 during the mechanical transfer.
- is more ergonomic for a Rayleigh analysis of the nanotubes, especially in a 90° geometry, as there is less parasitic signal originating from the scatter from the comb 1.

The width of the teeth 3 allows lithography, making it possible to locate the catalyst that initiates growing the nanotubes.

The comb 1 is adapted to operation of the invention under vacuum. The presence of several teeth 3 allows several objects 6 to be available, and thus makes it possible to transfer them under vacuum one after another (either for re-testing, or to different places), without breaking the vacuum.

The embodiment of the method according to the invention illustrated comprises, before the approach step described hereinafter, depositing or growing carbon nanotubes 6 on the comb 1.

This depositing comprises:
depositing catalyst on the comb 1, then
growing nanotubes 6 on the comb 1 in solution or preferably by evaporation.

This growing can be carried out outside or inside the enclosure 4 described hereinafter. It is preferably carried out in a growing oven, in the presence of $CH_4$, $H_2$ and Ar, brought to 900° C.

If this growing is carried out inside the enclosure, the method according to the invention preferably comprises maintaining the vacuum at a pressure less than $10^{-6}$ bar from the end of the growing step to the transfer step, preferably to the encapsulation step (described hereinafter) under vacuum at a pressure less than $10^{-6}$ bar of the transferred nano-object 6 in the deposit area 7.

Thus, the carbon nanotubes are formed directly on the comb 1 by depositing catalyst in liquid solution on the comb 1.

The catalyst (typically a solution of $Fe(NO_3)_3$, $MoO_2$, $Al_2O_3$) is deposited:
either uniformly,
or non-uniformly on the comb 1, i.e. it is deposited in a localized manner on a surface area less than 500 μm² per tooth 3 at the end of several teeth 3 of the comb 1, preferably at the end of each tooth 3 of the comb 1, typically by an optical lithography method.

The growing step is obtained by chemical vapour deposition (CVD) at 900° C. under a stream of methane and hydrogen and argon.

Evaporation allows the controlled, single deposit of a nano-object, the method comprising monitoring the electrical response of the object 6. The object 6 is sensitive to the absorption of a single molecule. The response is monitored between the teeth 3 of the pair 33 by virtue of the presence of electrodes on the comb 1 produced before growing the object 6.

The holder or comb 1 can comprise an adhesion layer for a nano-object, such as for example an adhesion polymer.

The embodiment of the method according to the invention illustrated comprises, before the approach step described hereinafter, a step of locating and selecting, on the comb 1, the nano-object 6 to be transferred.

It can in fact be seen as illustrated in FIG. 1, that the comb 1 carries several objects, but that:
The nano-objects between the pair 333 of teeth 33 appear too numerous,
The nano-objects between the pair 332 of teeth 33 appears too far from the end of the teeth 3 of this pair 332.
The selection comprises:
measuring presence of the object 6, and/or
measuring the conductivity of the object 6 (comprising quantification of this conductivity and/or determining a status such as metallic or semiconductor of the object 6), and optionally measuring its gap if it is a semiconductor and/or
measuring chirality of the object 6 and/or
measuring defects of the object 6 and/or
measuring the size of the object 6 and/or the number of atomic layers of the object 6 to be transferred,
in order to verify its properties and/or to distribute it among various objects 6 among the different pairs of teeth 33.

Thus typically, at least one of these selections is implemented:
by an optical method, preferably Rayleigh spectroscopy,
by the electrodes carried by the comb 1 (save with respect to the chirality).

In practice, at least one of these selections is implemented by a Rayleigh spectroscopy method (more accurate), the comb electrodes (less accurate) being used instead for monitoring the occurrence of defects (in particular desired defects such as molecular functionalizations) during a step of growing the object 6 (such as a carbon nanotube).

Figure 2:
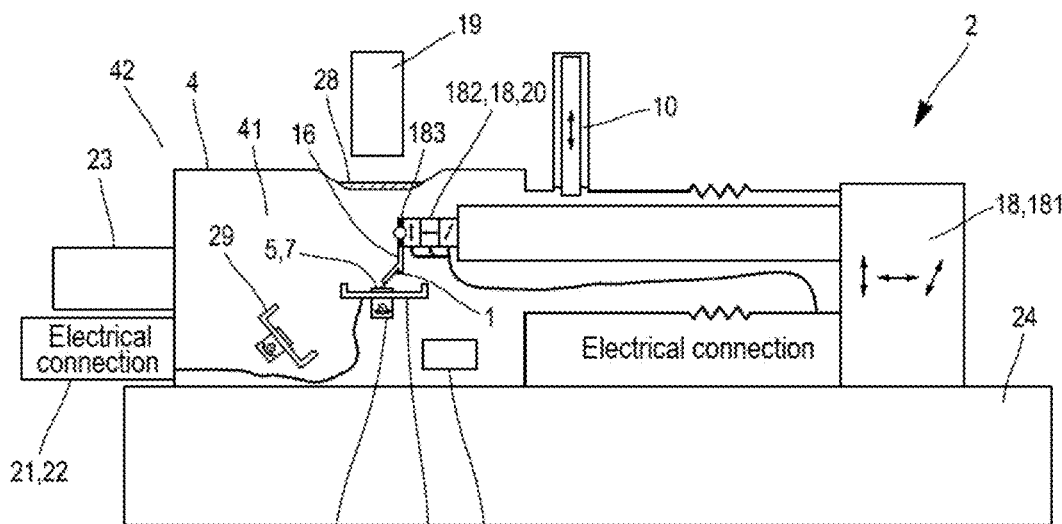
FIG. 2 is a diagrammatic view of a device 2 according to the invention.

Now with reference to FIG. 2, a device 2 according to the invention for the deposit or transfer or integration of an object 6 will be described.

The device 2 comprises an enclosure 4. This enclosure 4 is a closed enclosure, at least in a position of use of the device 2, in particular during the transfer step.

The enclosure is typically made from Dural.

This enclosure 4 is arranged to resist a pressure difference between its inside 41 and its outside 42 of at least 1 bar (its inside 41 being depressurized with respect to its outside 42).

The device 2 comprises means 16 (such as a receptacle with means for fastening the comb 1) arranged to carry, in a holder area (also called "comb area" in the case where the holder 1 is a comb 1), the comb 1 comprising at least two teeth 3 of the pair 33 carrying the object 6.

By "holder area" or "comb area" is meant an area arranged to accommodate and carry respectively the holder 1 or comb 1.

The device 2 comprises means 15 (such as a platform) arranged to carry a substrate 5 in a deposit area 7.

The device 2 comprises evacuation means 17, arranged to create a vacuum in the enclosure 4 at a pressure less than $10^{-6}$ bar, preferably less than $5.10^{-7}$ bar.

The evacuation means typically comprise a pump of the turbo-molecular type and a spiral pump (for the secondary and primary vacuum respectively).

The device 2 comprises handling means 18 arranged to approach the comb area and/or the comb in the enclosure 4, in the direction of the deposit area 7, so as to allow a transfer, in the enclosure 4, of a nano-object 6 from the comb area to the deposit area 7 (typically while the deposit area 7 is inserted between the two teeth 3 of the pair 33).

The handling means 18 comprise at least one series of micromanipulators, each series being arranged to displace the means 16 along three orthogonal axes. In FIG. 2, the handling means 18 comprise two series of micromanipulators 181, 182 in series and having spatial resolutions that are finer close to the means 16. Typically, the means 18 comprise micromanipulators combined with piezo-electric motors (attocube) allowing accurate positioning of the comb 1 with respect to the substrate 5.

The handling means 18 comprise means 183 for adjusting the angles (roll, pitch, yaw, about three axes perpendicular to one another) between:
  the comb area or the comb 1 and
  the target substrate 5 or the deposit area 7.

The handling means 18 are arranged to approach the comb area, in the enclosure 4, in the direction of the deposit area 7, so as to allow a transfer, in the enclosure 4, of a nano-object 6 from the comb area to the deposit area 7 while the inside 41 of the enclosure 4 is under vacuum at a pressure less than $10^{-6}$ bar (preferably less than $5.10^{-7}$ bar) created by the evacuation means 17.

The device 2 comprises optical control means 19 arranged for optical control of:
  a tilt of the comb 1 with respect to the deposit area 7, and/or
  a relative position between the comb 1 and the deposit area 7, and/or
  at least one angle between the comb 1 and the deposit area 7.

The means 19 typically comprise:
  an optical objective (typically ×50), and
  a window 28 (sealed to gas but not to the light collected by the objective) separating the inside 41 and the outside 42 of the enclosure, the window 28 being arranged between the objective and the deposit area 7 and/or the means 15.

The device 2 comprises adjustment means 20 (comprising the means 18, 181, 182, 183) arranged to adjust, from the outside 42 of the enclosure 4:
  a tilt of the comb 1 with respect to the deposit area 7, on the inside 41 of the enclosure 4, and/or
  a relative position between the comb 1 and the deposit area 7, on the inside 41 of the enclosure 7, and/or
  at least one angle (preferably three angles about three perpendicular axes) between the comb 1 and the deposit area 7, on the inside 41 of the enclosure 7.

The adjustment means 20 are arranged so that the comb area can be mobile in rotation (about three perpendicular axes) and/or in translation with respect to the enclosure 4, while the deposit area 7 and/or the means 15 is(are) immobile with respect to the enclosure 4.

The device also comprises means 30 for adjusting the position of the deposit area 7 and/or the means 15 in rotation with respect to the enclosure 4.

The handling means 20 are arranged to approach the comb area, in the enclosure 4, in the direction of the deposit area 7, so as to allow a transfer, in the enclosure 4, of a nano-object 6 from the comb area to the deposit area 7 while the inside 41 of the enclosure 4 is at a temperature greater than −50° C. and/or less than +90° C., and/or while the temperature on the inside 41 of the enclosure 4 is equal to a temperature of the air on the outside 42 of the enclosure 4.

The device 2 comprises encapsulation means 29 arranged to encapsulate, in the enclosure 4 and under vacuum, at a pressure less than $10^{-6}$ bar, (preferably less than $5.10^{-7}$ bar) a transferred nano-object 6 in the deposit area 7.

By encapsulation is meant a protection of the object 6 from direct contact with an atmosphere when the inside of this enclosure 4 is returned to this atmosphere having a pressure greater than $10^{-6}$ bar.

The device 2 comprises electrical and/or electronic means 21 (starting from the means 15 to the outside of the enclosure 4) arranged to connect to:
  electrodes (including at least two measurement electrodes 91 and/or at least two pairs 92, 93 of cutting electrodes), and/or
  a circuit 9
situated in the deposit area 7 and carried by the substrate 5 placed on the means 15.

The electrical and/or electronic means 21 comprise means for carrying out an electrical measurement between two measurement electrodes 91 situated in the deposit area.

The means 21 typically comprise:
  A current generator and/or a voltage generator, and
  Respectively a voltmeter and/or an ammeter (and/or a synchronous detection).

The electrical and/or electronic means 21 comprise means 22 for causing a current (at least 20 µA) to flow or generating a voltage (at least 5 mV or even 10 mV) between the pair of cutting electrodes 92 situated in the deposit area 7 so as to cut a nano-object 6 between the pair of cutting electrodes 92.

The electrical and/or electronic means 21 comprise means 22 for causing a current (at least 20 µA) to flow or generating a voltage (at least 5 mV or even 10 mV) between the pair of cutting electrodes 93 situated in the deposit area 7 so as to cut a nano-object 6 between the pair of cutting electrodes 93.

The pairs of cutting electrodes respectively 92 and 93 are situated at the ends of the deposit area 7.

The device 2 comprises cleaning means 23 arranged to clean the deposit area 7 inside the enclosure 4, the cleaning means preferably comprising:
  an ion gun, preferably an argon ion gun, and/or
  stripping means arranged to strip a protective layer by means of a plasma that selectively etches this protective layer.

The device 2 comprises a valve 10 arranged in order to:
  in an open position (illustrated in FIG. 1), not isolate the comb area with respect to the deposit area 7, and
  in a closed position (in which, with respect to FIG. 1 the handling means 18 position the means 16 on the right in FIG. 2), isolate the comb area with respect to the deposit area 7.

Thus the valve 10 is arranged to create isolation between:
  the receptacle 16 on which the object 6 is located, and
  the inside 41 of the enclosure 4.

The device 2 is mounted on an air cushion table 24. This makes it possible to reduce the vibration (in particular of the pumping system 17).

Now with reference to FIGS. 1 to 7, an embodiment of the method according to the invention for depositing or transfer or integration of an object 6 will be described.

Firstly:
the comb 1 is placed on its receptacle 16,
the substrate 5 is placed on its receptacle 15.
Then the enclosure 4 is sealed closed.

A secondary vacuum is created in the enclosure 4, by the means 17, at a pressure less than $10^{-6}$ bar, preferably less than $5.10^{-7}$ bar, typically equal to $10^{-7}$ bar.

This embodiment of the method according to the invention then comprises, before the approach step described hereinafter, cleaning the deposit area 7 inside the enclosure 4, by:
the means 23 preferably comprising an ion gun, preferably an argon ion gun, and/or
by stripping a protective layer with a plasma that selectively etches this protective layer.

The cleaning step is carried out when the inside 41 of the enclosure 4 is under vacuum, at a pressure less than $10^{-6}$ bar, preferably less than $5.10^{-7}$ bar.

The vacuum at a pressure less than $10^{-6}$ bar (preferably less than $5.10^{-7}$ bar) is maintained from the cleaning step to the transfer step.

The comb 1 is isolated (in an area called buffer area) from the part of the inside 41 of the enclosure comprising the substrate 5 by a valve 10 closed during the cleaning step.

This cleaning allows optimal coupling between the object 6 and the substrate 5.

Then, the valve 10 is opened.

This embodiment of the method for depositing (or integration or transfer) of a nano-object 6 according to the invention then comprises an approach of the comb 1, in the enclosure 4, in the direction of a carrier substrate 5 carried by the means 15.

The deposit area 7 corresponds to a part of the substrate 5.

The approach comprises an optical control by the means 19:
of a tilt of the comb 1 with respect to the deposit area 7, and/or
of a relative position between the comb 1 and the deposit area 7, and/or
of at least one angle between the comb 1 and the deposit area 7.

Thus, the optical control is not only that of the tilt but also of the relative position, as well as the angles (roll, pitch, yaw), between the comb 1 and the target substrate 5.

These three angles (roll, pitch, yaw) are adjustable even when the enclosure 4 is closed. This positioning of the angles is beneficial as it makes it possible to access original properties of the nano-objects. For example, two superimposed graphene sheets with an angle of 1.1° become superconductive.

The tilt between the receptacle 16 and the target substrate 5 is important here to minimize the contact surface between the teeth 3 of the comb 1 and the target substrate 5.

Figure 3:
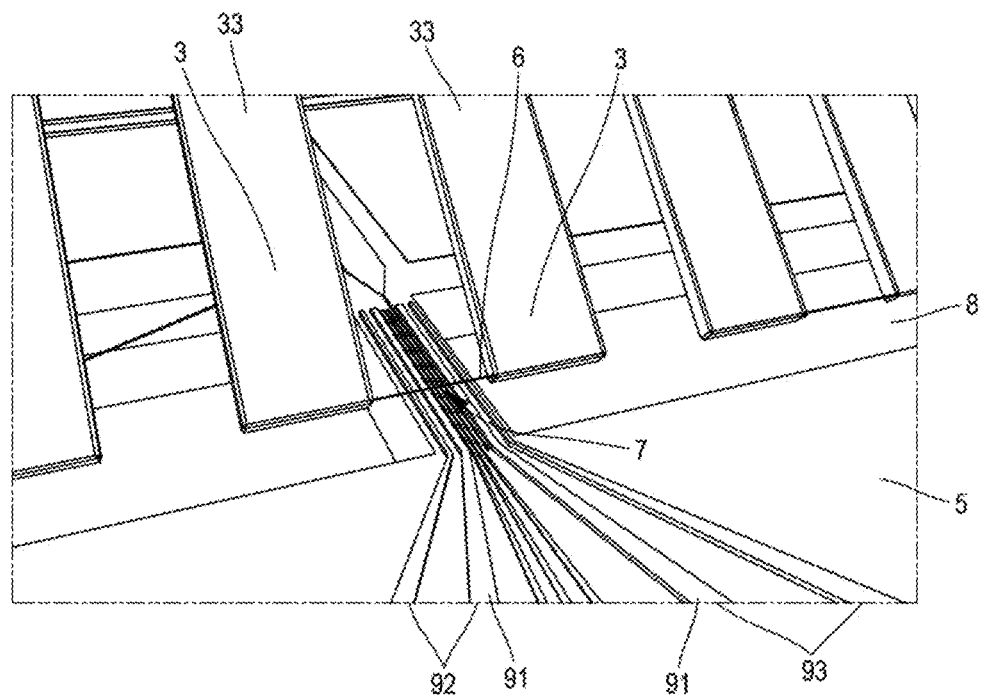
FIG. 3 is a diagrammatic perspective view of teeth 3 of the comb 1 carrying a nano-object 6 and positioned above a substrate 5.

As illustrated in FIG. 3, this embodiment of the method according to the invention then comprises an adjustment, by the means 20, and from the outside of the enclosure 4:
of a tilt of the comb 1 with respect to the deposit area 7, on the inside 41 of the enclosure 4, and/or
of a relative position between the comb 1 and the deposit area 7, on the inside 41 of the enclosure 4, and/or
of at least one angle between the comb 1 and the deposit area 7 on the inside 41 of the enclosure 4.

During the adjustment step:
the comb 1 is mobile with respect to the enclosure 4, and the deposit area 7 is immobile with respect to the enclosure 4.

Thus, a constraint is removed, as the deposit area 7 does not necessarily have to be in the shape of a point. The comb 1, which is mobile, can be minimally inserted around the deposit area 7.

Figure 4:
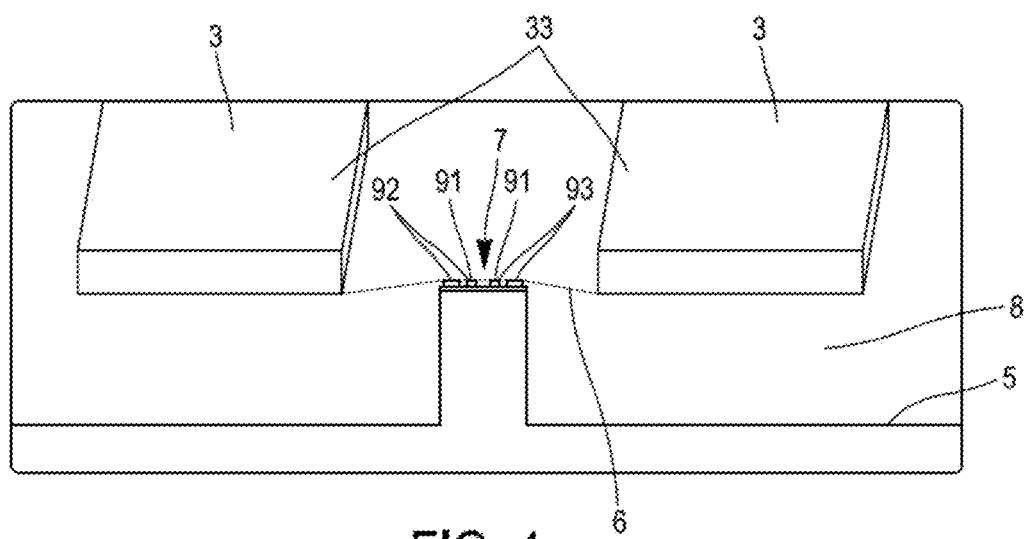
FIG. 4 is a diagrammatic profile view of teeth 3 of the comb 1 carrying the nano-object 6 and positioned above the substrate 5.

Then, as illustrated in FIG. 4, this embodiment of the method according to the invention comprises a mechanical transfer, in the enclosure 4, of the nano-object 6 of the pair 33, 331 starting from the holder 1 to the deposit area 7 of the carrier substrate 5.

This transfer is implemented starting from the comb 1 while the deposit area 7 is inserted between the two teeth 3 of the pair 33.

Thus, the mechanical transfer is carried out at the end of the manufacture of the assembly constituted by the substrate 5 and the object 6, which makes it possible to maintain the nano-object 6 pristine of all chemical residue.

The carrier substrate 5 comprises, on either side of the deposit area 7, (two) trenches 8 in which are inserted the teeth 3 of the comb 1 during the transfer.

The trenches 8 are cut in the substrate 5 on either side of the place where the nano-object 6 is to be deposited. Each trench 8 is 2 mm long, 200 μm wide and 15 μm deep.

The carrier substrate 5 comprises, in this non-limitative example, a silicon substrate.

The transfer step (as well as the approach step) is carried out when the inside 41 of the enclosure 4 is under vacuum, at a pressure less than $10^{-6}$ bar, preferably less than $5.10^{-7}$ bar.

The mechanical transfer is carried out under vacuum, which ensures a clean contact between the object 6 and the substrate 5, which ensures better coupling, greater stability and almost systematic integration.

The transfer (as well as the approach step) is carried out at a temperature on the inside 41 of the enclosure 4:
greater than −50° C., preferably greater than 0° C., preferably greater than 10° C. and/or
less than +90° C., preferably less than 40° C., preferably less than 30° C.

By "temperature of the enclosure" or "temperature inside the enclosure" is meant preferably at least the temperature of the inner walls of the enclosure 4 in contact with the atmosphere on the inside 41 of the enclosure 4. Locally, the receptacle 15 and/or the substrate 5 and/or the deposit area 7 can be cooled (for example by a laboratory cold finger) or heated (for example by a resistance).

During the transfer (as well as during the approach step) the temperature on the inside 41 of the enclosure 4 is equal to the temperature of the air on the outside 42 of the enclosure 4 and/or on the outside of the device 2.

In other words, the transfer (as well as the approach step) takes place at ambient temperature, preferably between 10° and 30°, typically between 17 and 27° C.

Figure 5:
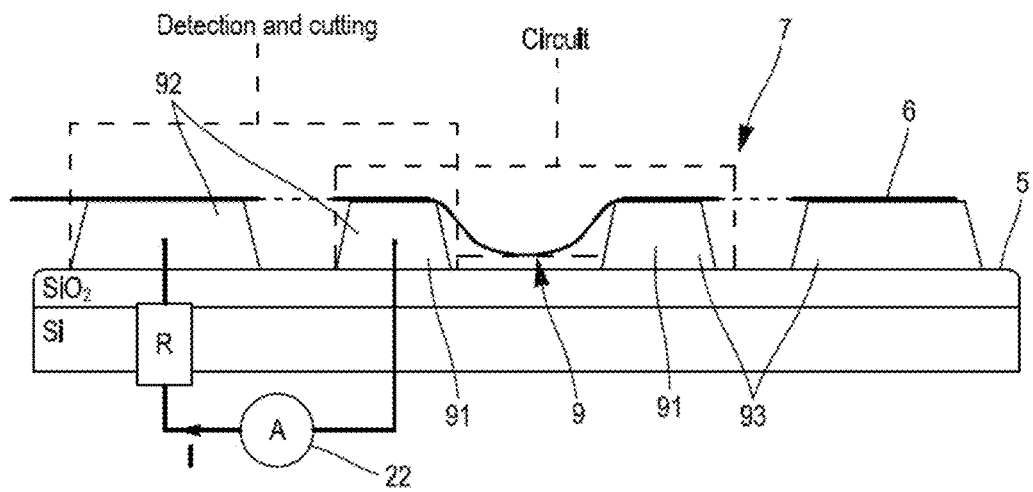
FIG. 5 is a more detailed profile view of the substrate 5, in particular of a deposit area 7.

As illustrated in FIG. 5, the deposit area 7 comprises:
electrodes 91, 92, 93, and/or
a circuit 9, typically electronic and/or photonic and/or micro-fluidic carried by the substrate 5,
such that these electrodes (and/or the circuit 9, as a function of the height of the electrodes) are in contact, at the end of the transfer step, with the transferred nano-object 6.

The electrodes 91, 92, 93 comprise two measurement electrodes 91 situated on the substrate 5 in the deposit area 7.

This embodiment of the method according to the invention comprises, during the transfer step, an electrical measurement between the two measurement electrodes 91 of the deposit area 7, typically a measurement of voltage or of current between the two measurement electrodes 91. This makes it possible to verify the presence of the object 6 between the electrodes 91 and its contact with the electrodes 91.

The contact between the object 6 and the substrate 5 is detected by continuously measuring the electric current between the two electrodes 91 (this current becoming non-zero when the object 6 touches the two electrodes 91).

After the contact of the nano-object 6 and the substrate 5, and before the cut described hereinafter, the nano-object 6, as well as its contact with the target substrate 5, is characterized by electrical measurements; if these measurements are not appropriate, a test can be carried out with another nano-object further along the comb 1. The electronic characteristics of the nanotube 6 in contact as described above can be measured: metallic, semiconductor, gap size, defects, etc.

The electrodes 91, 92, 93 comprise in the deposit area two pairs of electrodes called cutting electrodes 92, 93.

The two pairs 92 and 93 frame the electrodes 91.

One of the electrodes of the pair 92 is preferably merged with one of the electrodes 91 and one of the electrodes of the pair 93 is preferably merged with the other electrode 91.

The transfer comprises electric current flow between each pair 92, 93 of cutting electrodes, so as to cut the nano-object 6 between each pair of cutting electrodes.

Figure 6B:
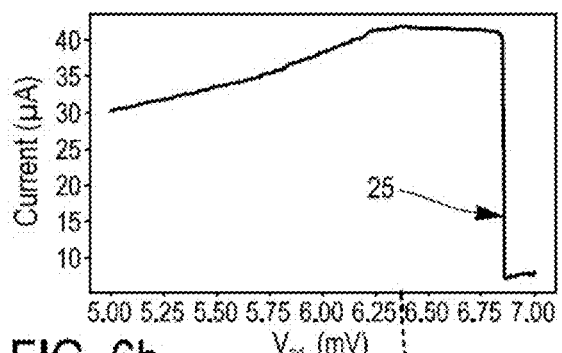
FIG. 6 illustrates.
in FIG. 6a a photo of the deposit area 7 and of its electrodes 91, 92, 93,
  in FIG. 6b an increase of electric current between the pair 92 of electrodes until the nano-object 6 is broken or cut 25 between the electrodes of the pair 92,
  in FIG. 6c an increase of electric current between the pair 93 of electrodes until the nano-object 6 is broken or cut 26 between the electrodes of the pair 93.
Figure 6C:
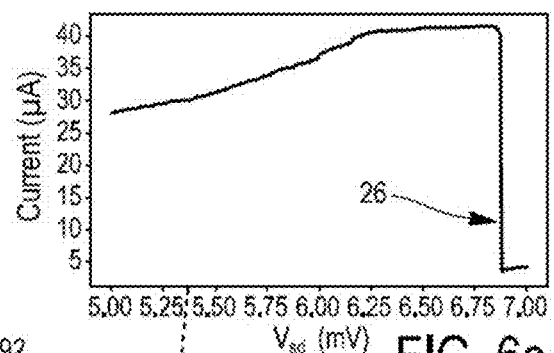
Figure 6A:
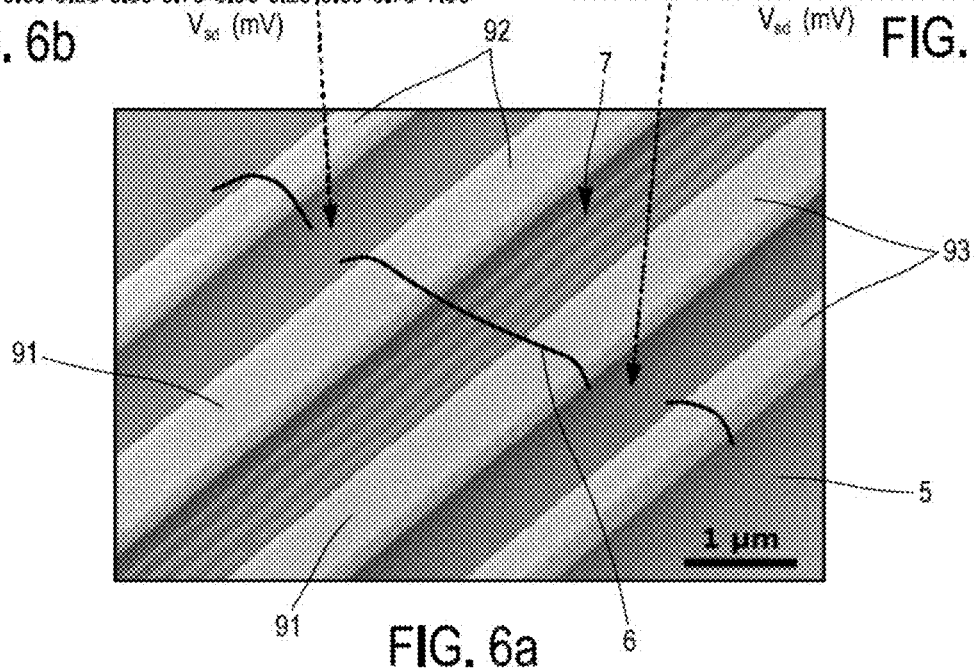

FIG. 6 illustrates:
in FIG. 6a a photo of the deposit area 7 and of its electrodes 91, 92, 93,
in FIG. 6b an increase of electric current (by the means 22) between the pair 92 of electrodes until the nano-object 6 is broken or cut 25 between the electrodes of the pair 92,
in FIG. 6c an increase of electric current (by the means 22) between the pair 93 of electrodes until the nano-object 6 is broken or cut 26 between the electrodes of the pair 93.

The object 6 is cut in two places situated between the teeth 3 of the pair 33 so as to separate it from the comb 1 and attach it to the substrate 5.

The cut gives information on the transferred object 6. If for example there are several nanotubes, they will be cut for different electric current values: there will be steps in the abrupt current reduction indicating the cut.

An advantage of this embodiment of the invention with respect to the state of the art is the ability to remove the nano-object 6 with the Ar plasma in situ, while protecting the comb 1 in the buffer area. The operation can then be re-started.

After cutting, this embodiment of the method according to the invention therefore comprises a step of verification of the nature and/or quality of the deposited nano-object 6 (this quality being for example a number of current jump steps measured during the cut) and in the case of non quality (for example in the case of a number of jumps greater than 1, or above an upper threshold and/or below a lower threshold):
returning the holder 1 to the buffer area,
closing the buffer area by means of the valve 10,
cleaning the deposit area 7 by the means 23,
opening the valve 10 and exiting the holder 1,
reiterating the transfer step.

It is noted that the method according to the invention can comprise a displacement of the comb 1 by the means 18 between different reiterations of a transfer of the object 6 as described above, so as to:

deposit several nano-objects 6 (initially carried by the comb 1 between different pairs of teeth 3) at different places on the substrate 5; for example, as illustrated in FIG. 7, the substrate can in certain variants comprise several deposit areas 7 such as the deposit area 7 described above and/or
stack several nano-objects 6 (initially carried by the comb 1 between different pairs of teeth 3) on the substrate 1, without breaking the vacuum created by the means 17.

FIG. 7 illustrates a substrate having for each deposit area 7 a quantum qubit architecture (the two areas 7 being connected by a coupling system), compatible with the invention. Implementing the invention for depositing a carbon nanotube on each area 7 on such an architecture improves by a factor of around 100 the characteristic lifetime of a quantum excitation with respect to depositing a carbon nanotube on this same architecture but by a method according to the state of the art. The intrinsic noise limit for quantum excitations, fixed by the proportion of carbon atoms 13 in the nanotube, is thus reached according to the invention, highlighting the high cleanliness of the device.

Then, this embodiment of the method according to the invention comprises an encapsulation, on the inside 41 of the enclosure 4 and under vacuum at a pressure less than $10^{-6}$ bar (preferably less than $5.10^{-7}$ bar), of the transferred nano-object 6.

Two types of encapsulation are possible:
a sealed encapsulation of the transferred nano-object 6, where all of the target substrate 5 is maintained under vacuum (the encapsulation can be done by closing a sealed cover over the target substrate 5, for example by using a cover mounted on a ball-head rod inside the enclosure 4), or
an encapsulation of the transferred nano-object 6 only, by covering it with a material or a nanomaterial that makes it possible to isolate the nano-object 6 from the ambient atmosphere.

In a continuation of the method, the encapsulated nano-object 6 can then be transported under vacuum and remaining constantly under vacuum, for example when removing it from the enclosure 4 and placing it in another item of equipment, for example in a cryostat.

Now with reference to FIG. 8, a variant of the comb 1, a variant of the device 2 and a variant of the method according to the invention will be described.

These variants will be described only in respect of their differences in comparison with those described above with reference to FIGS. 1 to 7.

In these variants, the nano-object 6 is a two-dimensional heterostructure or a nanoleaf, and typically comprises graphene.

Figure 8:
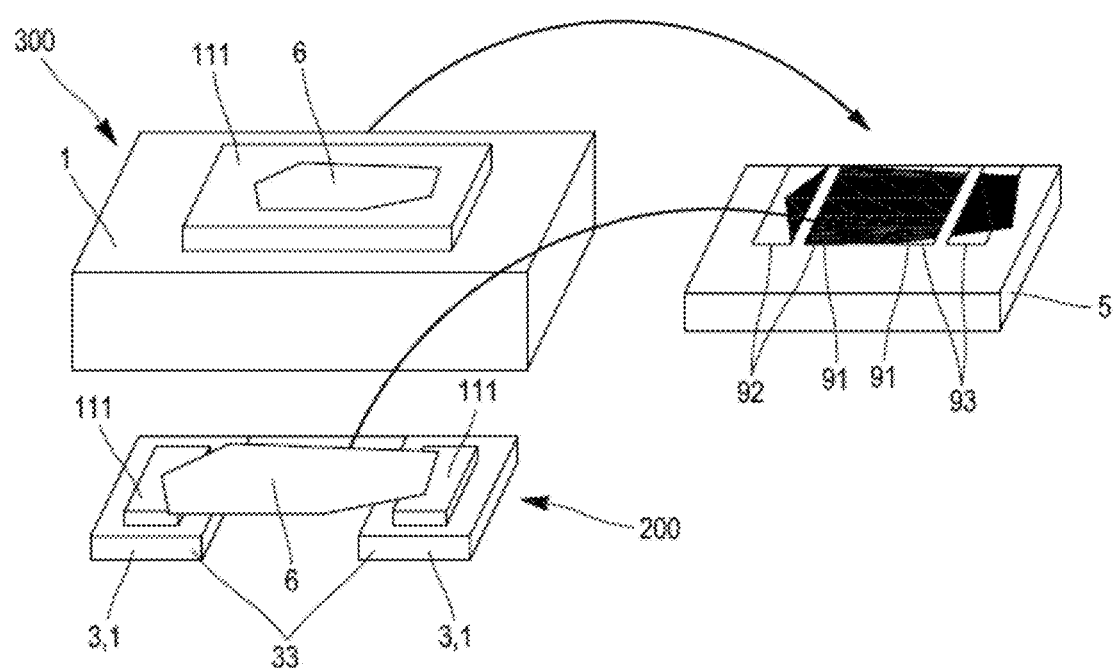
FIG. 8 illustrates a comb variant of the device and method according to the invention.

As in the case of the nanotube of the preceding figures, the object 6 illustrated in FIG. 8 is transferred under vacuum while being carried by a holder 1, more specifically while being carried:
between two teeth 3 of the holder or comb 1 (case referenced 200), preferably while the deposit area 7 is situated between the teeth 3, or
on a flat holder 1 (case referenced 300).

The object 6 is carried by the holder 1 preferably by means of an adhesion polymer 111.

Use of the comb 1 makes it possible to avoid contaminating the graphene 6 deposited (on the electrodes 91 and/or the circuit 9) with the adhesion polymer 111.

As above, the object 6 is cut by the pairs 92, 93 and separated from the holder 1.

Very advantageously, the cut can be carried out for an object 6 comprising two-dimensional conductive materials. It makes it possible to separate only a first layer if the material is constituted by several leaves on the comb 1 and it is desired to separate only the first leaf from the comb 1 to the substrate 5.

The invention allows almost systematic non-destructive integration of a nano-object 6 on the substrate 5.

The invention reduces the contamination and degradation that may arise from chemical methods, and therefore improves the performance and tunability of the object 6 assembled with the substrate 5.

The invention also makes it possible to select the object 6 assembled with the substrate 5.

By virtue of the controlled atmosphere in the enclosure 4, the connection between the object 6 and the substrate 5 is optimal.

The invention makes it possible to transfer a carbon nanotube 6 mechanically with a success rate close to 100%, i.e. with high efficiency. The invention makes it possible to transfer a nano-object 6 while retaining flexibility on the substrate 5, i.e. with the minimum of stresses on the target substrate 5.

The invention makes it possible to transfer a nano-object 6 with rapid execution by virtue of the optical control.

The mechanical transfer maintains the crystallinity of the nano-object 6.

Moreover, the comb 1 allows the ability to test a large number of objects 6, optically characterized beforehand, typically by the Rayleigh method.

The comb 1 has the advantage of the ability to handle the object 6 pristine of any defect and any residue. For example, functionalizing a nanotube with a single molecule amounts to adding a defect in a controlled manner. It is therefore advantageous to have a pristine nanotube without defects so that these do not enter into competition with the effect of the single molecule on the nanotube 6.

The applications of the invention are multiple, whether for manufacturing:
- a quantum circuit: the nanotube 6 can serve to create a quantum dot (in which an electron is trapped in three dimensions) or a unidimensional channel for electrons,
- an opto-electronic component: the nanotube 6 can serve as a single-photon source,
- a nano-transistor,
- or others: a device for the mechanical transfer of graphene, two-dimensional heterostructures, nanowires, etc.

Of course, the invention is not limited to the examples which have just been described and numerous adjustments can be made to these examples without exceeding the scope of the invention.

Thus, in variants that can be combined together of the embodiments described above:
the nano-object to be transferred can be a nanotube or a nanofibre or a nanowire or graphene or a two-dimensional heterostructure (i.e. superimposition of layers of graphene or other two-dimensional materials such as hexagonal boron nitride (h-BN) or a nanoleaf.

Of course, the different characteristics, forms, variants and embodiments of the invention can be combined with one another according to various combinations inasmuch as they are not incompatible or mutually exclusive. In particular, all the variants and all the embodiments described above can be combined with one another.

The invention claimed is:

1. A method for depositing an object, comprising:
    an approach, of a comb in an enclosure, in the direction of a carrier substrate, the comb comprising at least two teeth, wherein a pair of adjacent teeth carries an object to be transferred, extended between the two teeth of the pair; then
    a transfer, in the enclosure, of the object from the comb and to a deposit area of the carrier substrate while the deposit area is inserted between the two teeth of the pair; and
    the transfer step is carried out while the inside of the enclosure is under vacuum at a pressure less than $10^{-6}$ bar.

2. The method according to claim 1, characterized in that the approach comprises an optical control:
    of a tilt of the comb with respect to the deposit area, and/or
    of a relative position between the comb and the deposit area, and/or
    of at least one angle between the comb and the deposit area.

3. The method according to claim 2, characterized in that the approach comprises an adjustment, from outside the enclosure, of:
    a tilt of the comb with respect to the deposit area, inside the enclosure, and/or
    a relative position between the comb and the deposit area inside the enclosure, and/or
    at least one angle between the comb and the deposit area inside the enclosure.

4. The method according to claim 3, characterized in that during the adjustment step:
    the comb is mobile with respect to the enclosure, and
    the deposit area is immobile with respect to the enclosure.

5. The method according to claim 1, characterized in that the transfer is carried out at a temperature inside the enclosure greater than −50° C. and/or less than +90° C.

6. The method according to claim 1, characterized in that the temperature inside the enclosure is equal to a temperature outside the enclosure.

7. The method according to claim 1, comprising an encapsulation, in the enclosure and under vacuum at a pressure less than $10^{-6}$ bar of the transferred object.

8. The method according to claim 1, characterized in that the carrier substrate comprises, on either side of the deposit area, trenches in which the teeth of the comb are inserted during the transfer.

9. The method according to claim 1, characterized in that the deposit area comprises electrodes or an electronic circuit, such that these electrodes and/or the electronic circuit are in contact, at the end of the transfer step, with the object to be transferred.

10. The method according to claim 9, comprising, during the transfer step, an electrical measurement between two measurement electrodes of the deposit area.

11. The method according to claim 9, characterized in that the deposit area comprises two pairs of electrodes called cutting electrodes, the transfer comprising an electric current flow between each pair of cutting electrodes so as to cut the object between each pair of cutting electrodes.

12. The method according to claim 1, comprising, before the approach step, cleaning the deposit area inside the enclosure, the cleaning being carried out while the inside of the enclosure is under vacuum, at a pressure less than $10^{-6}$ bar, the vacuum at a pressure less than $10^{-6}$ bar being maintained from the cleaning step to the transfer step.

13. The method according to claim 12, characterized in that the comb is isolated from the substrate by a valve closed during the cleaning step.

14. The method according to claim 1, characterized in that the object to be transferred is a carbon nanotube, a nanowire and/or graphene or a two-dimensional hetero structure.

15. The method according to claim 1, characterized in that the comb:
   comprises at least five teeth, preferably at least 25 teeth, and/or
   has pairs of adjacent teeth spaced apart by a gap, defined in a direction of alignment of the teeth, greater than 5 µm and/or less than 100 µm, and/or
   has teeth each having a width, defined in a direction of alignment of the teeth, greater than 5 µm and/or less than 100 µm, and/or
   has teeth each having a length, defined in a direction perpendicular to the direction of alignment of the teeth, greater than 5 µm and/or less than 1000 µm.

16. The method according to claim 1, comprising, before the approach step, depositing carbon nanotubes on the comb, comprising:
   depositing catalyst on the comb; then
   growing nanotubes on the comb.

17. The method according to claim 16, characterized in that the catalyst is not deposited uniformly on the comb but is deposited in a localized manner on a surface area less than 500 µm$^2$ per tooth at the end of several teeth of the comb.

18. The method according to claim 1, comprising, before the approach step, a step of locating and selecting, on the comb, the object to be transferred.

19. The method according to claim 18, characterized in that the selection comprises measuring conductivity and/or chirality and/or defects in the object to be transferred.

20. A device for depositing an object comprising:
   an enclosure;
   means arranged for carrying, in a comb area, a comb comprising at least two teeth;
   means arranged to carry a substrate in a deposit area;
   evacuation means, arranged to create a vacuum in the enclosure at a pressure less than $10^{-6}$ bar; and
   handling means arranged to approach the comb area, in the enclosure, in the direction of the deposit area, so as to allow a transfer, in the enclosure, of an object, from the comb area to the deposit area;
   characterized in that the handling means are arranged to approach the comb area, in the enclosure, in the direction of the deposit area, so as to allow a transfer, in the enclosure, of an object, from the comb area to the deposit area while the inside of the enclosure is under vacuum, at a pressure less than $10^{-6}$ bar, created by the evacuation means.

21. The device according to claim 20, comprising optical control means arranged for optical control of:
   a tilt of the comb with respect to the deposit area, and/or
   a relative position between the comb and the deposit area, and/or
   at least one angle between the comb and the deposit area.

22. The device according to claim 21, comprising adjustment means arranged to adjust, from the outside of the enclosure:
   a tilt of the comb with respect to the deposit area, inside the enclosure, and/or
   a relative position between the comb and the deposit area, inside the enclosure, and/or
   at least one angle between the comb and the deposit area inside the enclosure.

23. The device according to claim 22, characterized in that the adjustment means are arranged so that the comb area can be mobile with respect to the enclosure, while the deposit area is immobile with respect to the enclosure.

24. The device according to claim 20, characterized in that the handling means are arranged to approach the comb area, in the enclosure, in the direction of the deposit area, so as to allow a transfer, in the enclosure, of an object from the comb area to the deposit area while the inside of the enclosure is at a temperature greater than −50° C. and/or less than +90° C.

25. The device according to claim 20, characterized in that the handling means are arranged to approach the comb area, in the enclosure, in the direction of the deposit area, so as to allow a transfer, in the enclosure, of an object from the comb area to the deposit area while the temperature inside the enclosure is equal to a temperature outside the enclosure.

26. The device according to claim 20, comprising encapsulation means arranged to encapsulate, in the enclosure and under vacuum at a pressure less than $10^{-6}$ bar, a transferred object in the deposit area.

27. The device according to claim 20, comprising electrical and/or electronic means arranged to be connected to electrodes or an electronic circuit situated in the deposit area.

28. The device according to claim 27, characterized in that the electrical and/or electronic means comprise means for carrying out an electrical measurement between two measurement electrodes situated in the deposit area.

29. The device according to claim 27, characterized in that the electrical and/or electronic means comprise means for causing a current to flow between each pair of cutting electrodes situated in the deposit area so as to cut an object between each pair of cutting electrodes.

30. The device according to claim 20, comprising cleaning means arranged to clean the deposit area inside the enclosure.

31. The device according to claim 30, comprising a valve arranged in order to:
   in a closed position, isolate the comb area with respect to the deposit area, and
   in an open position, not isolate the comb area with respect to the deposit area.

32. The device according to claim 20, wherein the object to be transferred is a carbon nanotube, a nanowire and/or graphene or a two-dimensional heterostructure.

* * * * *